United States Patent
Asai

(10) Patent No.: US 8,168,549 B2
(45) Date of Patent: May 1, 2012

(54) METHOD OF MANUFACTURING SEMICONDUCTOR DEVICE AND SUBSTRATE PROCESSING APPARATUS

(75) Inventor: Masayuki Asai, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 12/880,287

(22) Filed: Sep. 13, 2010

(65) Prior Publication Data

US 2011/0065289 A1    Mar. 17, 2011

(30) Foreign Application Priority Data

Sep. 14, 2009  (JP) .................................. 2009-212150
Jun. 30, 2010  (JP) .................................. 2010-150217

(51) Int. Cl.
    *H01L 21/469* (2006.01)
(52) U.S. Cl. ................... 438/791; 257/E21.293
(58) Field of Classification Search ................... 438/791
    See application file for complete search history.

(56) References Cited

U.S. PATENT DOCUMENTS

| 6,391,803 B1 * | 5/2002 | Kim et al. ................... 438/787 |
| 6,962,876 B2 * | 11/2005 | Ahn et al. ................... 438/680 |
| 7,338,900 B2 * | 3/2008 | Mizuno et al. ............... 438/680 |
| 2003/0098480 A1 * | 5/2003 | Zheng et al. ................ 257/296 |
| 2006/0286820 A1 * | 12/2006 | Singh et al. ................. 438/792 |

FOREIGN PATENT DOCUMENTS

| JP | 2003-218106 | 7/2003 |
| JP | 2009062606 | 3/2009 |
| KR | 1020020085487 | 11/2002 |

* cited by examiner

*Primary Examiner* — William D Coleman
(74) *Attorney, Agent, or Firm* — Brundidge & Stanger, P.C.

(57) ABSTRACT

There are provided a method of manufacturing a semiconductor device and a substrate processing apparatus by which the quality of a silicon nitride film can be improved. The method comprises: (a) supplying a silicon-containing gas into a process chamber accommodating a substrate in a heated state; (b) switching between an exhaust stop state and an exhaust operation state at least two times while a nitrogen-containing gas is supplied into the process chamber so as to vary an inside pressure of the process chamber such that a maximum inside pressure of the process chamber is at least twenty times higher than a minimum inside pressure of the process chamber. The steps (a) and (b) are alternately repeated to form a silicon nitride film on the substrate.

2 Claims, 9 Drawing Sheets

PRESENT INVENTION EXAMPLE

CONVENTIONAL EXAMPLE

1

METHOD OF MANUFACTURING SEMICONDUCTOR DEVICE AND SUBSTRATE PROCESSING APPARATUS

CROSS-REFERENCE TO RELATED PATENT APPLICATION

This U.S. non-provisional patent application claims priority under 35 U.S.C. §119 of Japanese Patent Application Nos. 2009-212150, filed on Sep. 14, 2009, and 2010-150217, filed on Jun. 30, 2010, in the Japanese Patent Office, the entire contents of which are hereby incorporated by reference.

BACKGROUND OF THE INVENTION

1. Field of the Invention

The present invention relates to a method of manufacturing a semiconductor device and a substrate processing apparatus, and more particularly, to a method of manufacturing a semiconductor device by forming a silicon nitride film by an atomic layer deposition (ALD) method, and a substrate processing apparatus.

2. Description of the Related Art

As one of semiconductor device manufacturing processes, there is a film forming process in which a predetermined thin film is deposited on a substrate by a chemical vapor deposition (CVD) method or an ALD method. In a CVD method, a thin film including elements of source molecules is deposited on a substrate by gaseous reaction and surface reaction of gaseous sources. Among CVD methods, a method of controlling deposition of a thin film on an atomic layer basis is called "ALD method" or "cyclic CVD." The ALD method is distinguishably characterized in that two or more kinds of source gases are alternately supplied to a substrate to form a thin film, and the thickness of the thin film is controlled by adjusting the repetition number (cycle number) of the alternate supply of the source gases.

In a conventional art, amorphous silicon nitride films are formed in suing a vertical semiconductor manufacturing apparatus (substrate processing apparatus) configured to accommodate substrates (wafers) vertically in multiple stages by an ALD or cyclic CVD method using $SiH_2Cl_2$ (dichlorosilane, DCS) and $NH_3$ (ammonia) (for example, refer to Patent Document 1).

A silicon nitride film may be formed on a substrate, for example, by repeating a DCS supply process, a $N_2$ purge process, a $NH_3$ supply process, and a $N_2$ purge process (hereinafter, simply referred to as a cycle treatment). By this, the silicon nitride film can be deposited on the substrate to a predetermined thickness.

[Patent Document 1] Japanese Unexamined Patent Application Publication No. 2003-218106

However, a silicon nitride film formed on a substrate by repeating the cycle treatment may have the following disadvantages.

First, due to insufficient nitriding, the silicon nitride film may have poor insulating properties.

Secondly, byproducts may permeate the silicon nitride film to result in poor insulating properties and generation of particles.

Such disadvantages of the conventional art relating to film quality are caused by poor nitriding in a $NH_3$ supply process and are more notable if the process time of a cycle treatment is decreased, the temperature of a substrate is decreased, a silicon nitride film pattern formed on the substrate is fine, or the number of substrates to be batch-processed is increased.

In the conventional art, to solve such disadvantages, the flow rate of $NH_3$ and the time of $NH_3$ treatment are increased while keeping the inside pressure of a process chamber (reaction chamber) constant in a $NH_3$ supply process so as to increase nitriding power. Although the velocity of gas (the flow rate of gas) on a substrate can be increased by the conventional method, since chemical reaction or adsorption reaction are determined by the stay time or concentration of a source supplied to a substrate or the pressure of the source, the conventional method is not so advantageous but the efficiency of gas consumption is decreased and productivity is not improved.

SUMMARY OF THE INVENTION

An object of the present invention is to provide a method of manufacturing a semiconductor device and a substrate processing apparatus, by which the quality of a silicon nitride film can be improved.

According to an aspect of the present invention, there is provided a method of forming a silicon nitride film on the substrate, the method comprising: supplying a silicon-containing gas into a process chamber accommodating the substrate in a heated state; by opening a first valve; evacuating the process chamber by closing the first valve and opening an exhaust valve; supplying a nitrogen-containing gas into the process chamber by opening a second valve while switching between an exhaust stop state and an exhaust operation state at least two times by repeatedly opening and closing the exhaust valve with the second valve open so as to vary an inside pressure of the process chamber such that a maximum inside pressure of the process chamber is at least twenty times higher than a minimum inside pressure of the process chamber; and evacuating the process chamber by closing the second valve and opening the exhaust valve.

According to another aspect of the present invention, there is provided a substrate processing apparatus comprising: a process chamber configured to process a substrate;

a first gas supply unit configured to supply a silicon-containing gas into the process chamber by opening a first valve; a second gas supply unit configured to supply a nitrogen-containing gas into the process chamber;

by opening a second valve; a heater configured to heat the substrate in the process chamber;

an exhaust unit configured to evacuate the process chamber by opening an exhaust valve; and a controller configured to control the exhaust unit, the first gas supply unit, the second gas supply unit and the heater, wherein the controller controls the first valve and the second valve such that the silicon-containing gas and the nitrogen-containing gas are alternately supplied into the process chamber to form a silicon nitride film on the substrate, and the controller controls the exhaust unit to switch between an exhaust stop state and an exhaust operation state at least two times by repeatedly opening and closing the exhaust valve while maintaining the second valve open to supply the nitrogen-containing gas into the process chamber so as to vary an inside pressure of the process chamber such that a maximum inside pressure of the process chamber is at least twenty times higher than a minimum inside pressure of the process chamber.

BRIEF DESCRIPTION OF THE DRAWINGS

FIG. 7A and FIG. 7B are schematic views illustrating various gases exhausted through an exhaust system, in which FIG. 7A illustrates a comparative example and FIG. 7B illustrates an example.

DETAILED DESCRIPTION OF THE PREFERRED EMBODIMENTS

Hereinafter, an explanation will be given on a method of manufacturing a semiconductor device and a substrate processing apparatus according to an embodiment of the present invention with reference to the attached drawings.

(1) Structure of Substrate Processing Apparatus

Fig. is a schematic view illustrating a vertical process furnace (reaction furnace) 202 of a substrate processing apparatus (semiconductor manufacturing apparatus) according to an embodiment of the present invention, in which a vertical sectional view of the process furnace 202 is shown. FIG. 2 is a sectional view taken along line A-A of the process furnace 202 of FIG. 1. However, the present invention is not limited to the substrate processing apparatus of the current embodiment. For example, the present invention can be applied to other substrate processing apparatuses such as a substrate processing apparatus having a single-wafer cold wall type process furnace.

Figure 1:
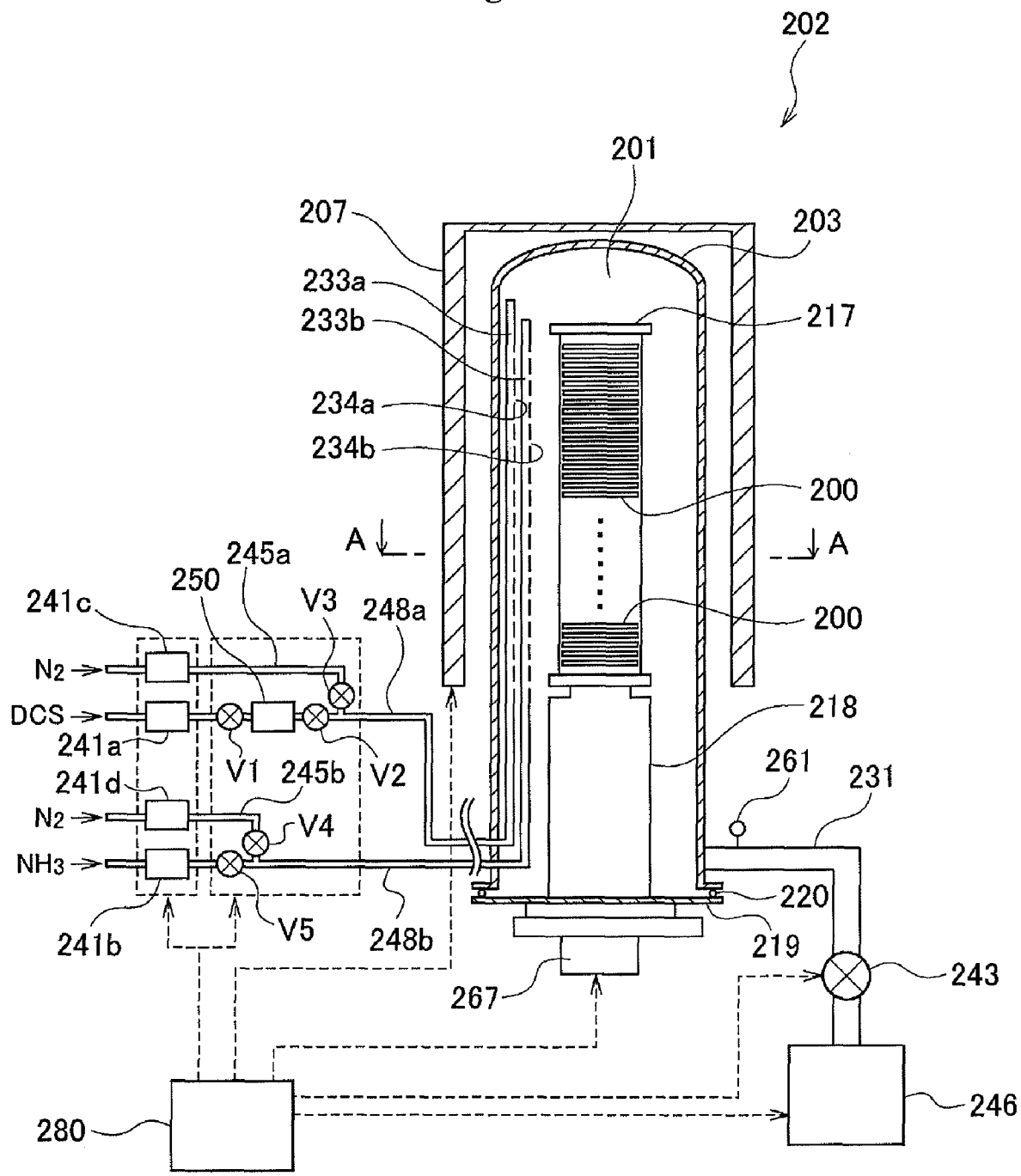
FIG. 1 is a schematic view illustrating a substrate processing apparatus according to an embodiment of the present invention.
Figure 2:
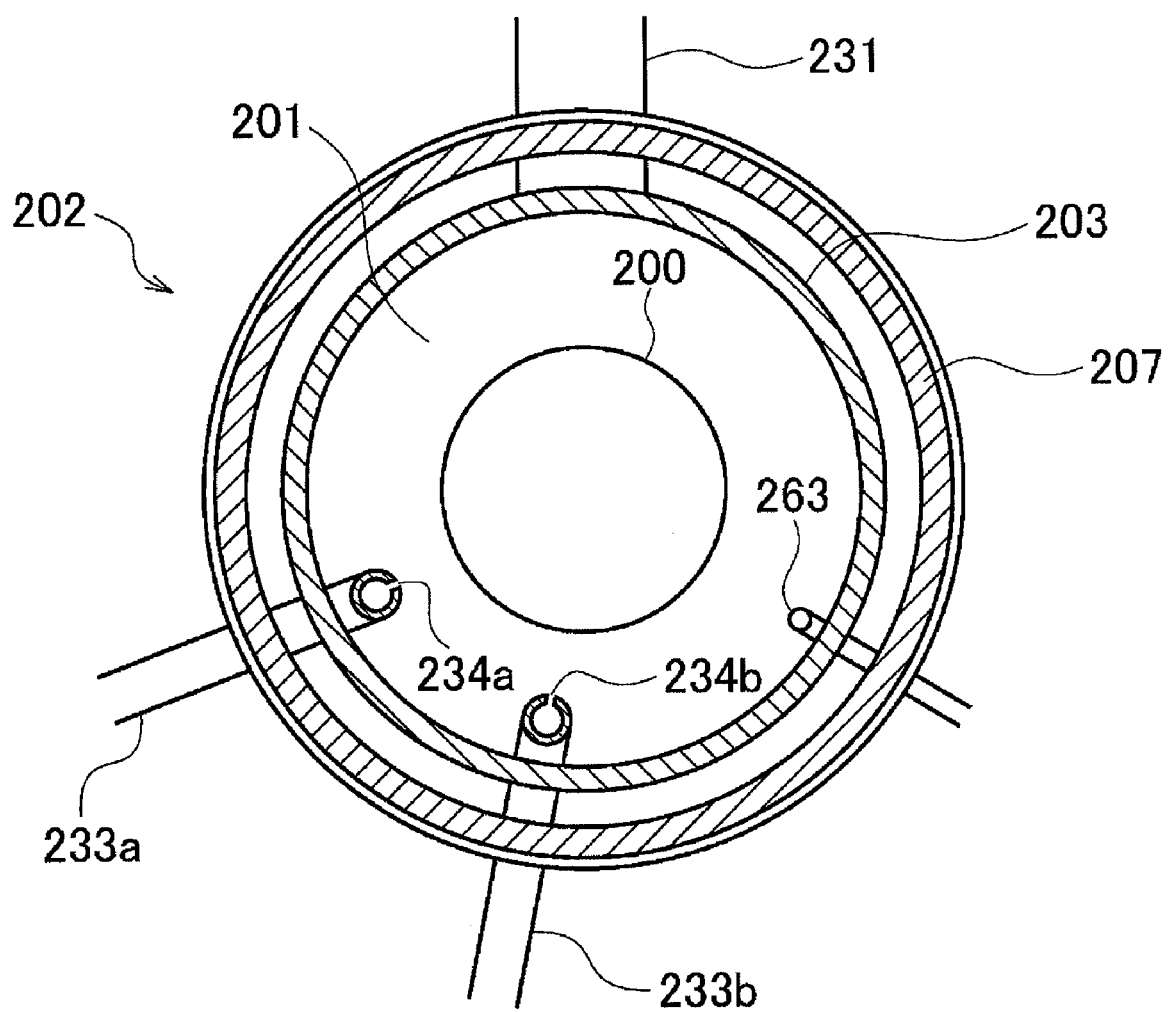
FIG. 2 is a sectional view taken along line A-A of FIG. 1.

As shown in FIG. 1, the process furnace 202 includes a heater 207 as a heating unit. The heater 207 has a cylindrical shape and is vertically installed on a heater base (not shown) used as a holding plate. At the inside of the heater 207, a reaction tube 203 is installed concentrically with the heater 207. The reaction tube 203 is made of a heat-resistant material such as a quartz ($SiO_2$) or silicon carbide (SiC) and has a cylindrical shape with a closed top side and an opened bottom side. In the reaction tube 203, a process chamber (reaction chamber) 201 is formed. The inside of the process chamber 201 is configured to accommodate a boat 217 in a state where substrates such as wafers 200 are horizontally positioned and vertically arranged in multiple stages in the 217.

At the lower side of the reaction tube 203, a seal cap 219 is installed as a furnace port cover capable of hermetically closing the opened bottom side of the reaction tube 203. The seal cap 219 makes contact with the bottom side of the reaction tube 203 in a perpendicular direction from the lower side. The seal cap 219 is made of a metal such as stainless steel and has a circular disk shape. On the surface of the seal cap 219, an O-ring 220 is installed as a seal member configured to make contact with the bottom side of the reaction tube 203. At a lower side of the seal cap 219, a rotation unit 267 is installed to rotate the boat 217. A rotation shaft (not shown) of the rotation unit 267 is installed through the seal cap 219 to rotate wafers 200 by rotating the boat 217. In addition, so as to prevent the rotation shaft of the rotation unit 267 from making contact with a film forming gas, an R-unit nozzle (not shown) is installed at the rotation unit 267 to blow $N_2$ gas toward the rotation shaft. In addition, the seal cap 219 is configured to be vertically moved by an elevating mechanism such as the boat elevator (not shown). The boat 217 can be loaded into and unloaded from the process chamber 201 by raising and lowering the seal cap 219.

The boat 217, which is a substrate holding tool, is made of a heat-resistant material such as quartz or silicon carbide and is configured to support a plurality of wafers 200 in a state where the wafers 200 are horizontally oriented and arranged at predetermined intervals in multiple stages. At the lower part of the boat 217, an insulating member 218 made of a heat-resistant material such as quartz or silicon carbide is installed so as to prevent heat transfer from the heater 207 to the seal cap 219. At the reaction tube 203, a temperature sensor 263 such as a thermocouple is installed as a temperature detector. By controlling power to the heater 207 based on temperature information detected by the temperature sensor 263, desired temperature distribution can be obtained in the process chamber 201. The temperature sensor 263 is installed along the inner wall of the reaction tube 203.

At the lower side of the reaction tube 203, a first nozzle 233a configured to supply a silicon-containing gas such as a dichlorosilane (DCS)-containing gas as a source gas into the process chamber 201, and a second nozzle 233b configured to supply a nitrogen-containing gas (nitriding gas) such as ammonia ($NH_3$)-containing gas as a reaction gas into the process chamber 201 are installed in a manner such that the first and second nozzles 233a and 233b penetrate the sidewall of the reaction tube 203. In the reaction tube 203, the first nozzle 233a and the second nozzle 233b are installed in a manner such that the first and second nozzles 233a and 233b extend from the lower side to the upper side of the reaction tube 203 along the inner wall of the reaction tube 203. In the side surfaces of the first nozzle 233a and the second nozzle 233b, first gas supply holes 234a and second gas supply holes 234b are respectively formed. The first and second gas supply holes 234a and 234b have proper sizes and are arranged at proper pitch from the lower side to the upper side. In addition, the downstream end of a first inert gas supply pipe 248a is connected to the upstream end of the first nozzle 233a to supply a DCS-containing gas. The downstream end of a second gas supply pipe 248b is connected to the upstream end of the second nozzle 233b to supply an ammonia-containing gas.

At the first gas supply pipe 248a, a flow rate control unit such as a mass flow controller 241a, an on-off valve V1, a buffer tank 250 configured to temporarily store a DCS-containing gas to be supplied into the process chamber 201, and an on-off valve V2 are sequentially from the upstream side of the first gas supply pipe 248a. In addition, the downstream side of a first nitrogen gas supply pipe 245a is connected to the first gas supply pipe 248a at the downstream side of the on-off valve V2 to supply an inert gas such as nitrogen ($N_2$) gas. At the first nitrogen gas supply pipe 245a, a flow rate control unit such as a mass flow controller 241c, and an on-off valve V3 are installed sequentially from the upstream side of the first nitrogen gas supply pipe 245a.

In addition, at the second gas supply pipe 248b, a flow rate control unit such as a mass flow controller 241b, and an on-off valve V5 are sequentially installed from the upstream side of the second gas supply pipe 248b. The downstream side of a second nitrogen gas supply pipe 245b is connected to the second gas supply pipe 248b at the downstream side of the on-off valve V5 to supply an inert gas such as nitrogen ($N_2$) gas. At the second nitrogen gas supply pipe 245b, a flow rate control unit such as a mass flow controller 241d, and an on-off valve V4 are installed sequentially from the upstream side of the second nitrogen gas supply pipe 245b.

An exhaust pipe 231 is connected to a lower sidewall of the reaction tube 203 to exhaust the inside of the process chamber 201. At the exhaust pipe 231, a pressure detector such as a pressure sensor 261, an exhaust valve 243, and a vacuum exhaust device such as a vacuum pump 246 are sequentially installed from the upstream side of the exhaust pipe 231. The exhaust valve 243 may be a simple on-off valve configured to open and close the exhaust pipe 231. However, in the current embodiment, an auto pressure controller (APC) valve is used as the exhaust valve 243. By opening and closing the APC valve, vacuum evacuation can be started and closed, and by adjusting the degree of opening of the APC valve, the inside pressure of the process chamber 201 can be controlled. That is, by operating the vacuum pump 246 and controlling the degree of opening of the APC valve 243 based on pressure information detected by the pressure sensor 261, the inside of the process chamber 201 can be kept at a constant pressure lower than the atmospheric pressure.

A controller 280 which is a control unit is connected to the mass flow controllers 241a to 241d; the on-off valves V1 to V5; the pressure sensor 261; the exhaust valve 243; the heater 207; the temperature sensor 263; the vacuum pump 246; the rotation unit 267; and the boat elevator. The controller 280 controls operations such as: flow rate control operations of the mass flow controllers 241a to 241d; opening and closing operations of the valves V1 to V5; opening and closing operations of the exhaust valve 243 and a pressure adjusting operation of the exhaust valve 243 based on the pressure sensor 261; a temperature adjusting operation of the heater 207 based on the temperature sensor 263; starting and stopping operations of the vacuum pump 246; a rotation speed adjusting operation of the rotation unit 267; and an elevating operation of the boat elevator.

[2] Method of Forming Silicon Nitride Film

Next, an explanation will be given on a method of forming silicon nitride films on wafers 200 in one of semiconductor device manufacturing processes by using the above-described substrate processing apparatus of FIG. 1. In the following description, the controller 280 controls parts of the substrate processing apparatus.

(Preliminary Process)

After a plurality of wafers 200 are placed in the boat 217, as shown in FIG. 1, the boat 217 is loaded into the reaction tube 203 by lifting the boat 217 with the boat elevator. The seal cap 219 seals the bottom side of the reaction tube 203 by using an O-ring 220b placed on the top surface of the seal cap 219 so that the inside of the process chamber 201 can be hermetically closed. The inside of the process chamber 201 is vacuum-evacuated by the vacuum pump 246. To keep the inside of the process chamber 201 at a predetermined temperature, power to the heater 207 is controlled based temperatures detected by the temperature sensor 263. Next, the boat 217 is rotated by the rotary mechanism 267 to rotate the wafers 200. Thereafter, silicon nitride films are formed as follows.

(Process of Forming Silicon Nitride Film)

In the current embodiment, a silicon nitride film forming process is performed through a cycle treatment by repeating the following four processes.

(1) DCS supply process: DCS-containing gas is supplied into the process chamber 201.

(2) $N_2$ purge process: while supplying nitrogen gas into the process chamber 201, the inside of the process chamber 201 is exhausted.

(3) $NH_3$ supply process: ammonia-containing gas is supplied into the process chamber 201.

(4) $N_2$ purge process: while supplying nitrogen gas into the process chamber 201, the inside of the process chamber 201 is exhausted.

Figure 3:
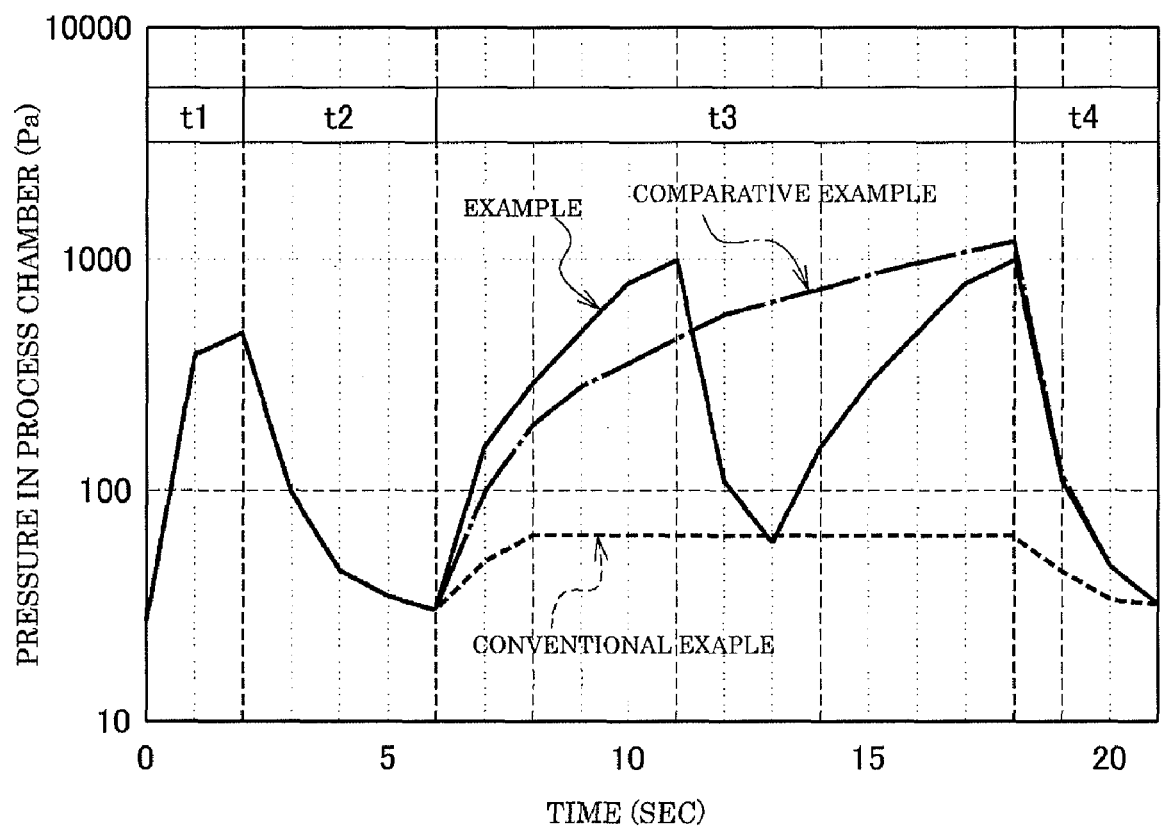
FIG. 3 is a graph illustrating pressure variations in a process chamber during a cycle for the cases of an example of the present invention, a comparative example, and a conventional example.

The cycle treatment of the film forming process will be explained while properly referring to an example of FIG. 3. FIG. 3 illustrates pressure variations in the process chamber 201 during one cycle, in which a time (period) t1 corresponds to (1) DCS supply process, a time (period) t2 corresponds to (2) $N_2$ purge process, a time t3 (period) corresponds to (3) $NH_3$ supply process, and a time (period) t4 corresponds to (4) $N_2$ purge process.

(1) DCS Supply Process

The on-off valve V2 of the first gas supply pipe 248a is opened, and DCS gas previously stored in the buffer tank 250 is supplied into the process chamber 201 all at once. The DCS gas is introduced into the first nozzle 233a from the first gas supply pipe 248a and is supplied into the process chamber 201 through the gas supply holes 234a of the first nozzle 233a. In addition, the on-off valve V4 of the second nitrogen gas supply pipe 245b is opened, so that $N_2$ gas the flow rate of which is controlled by the mass flow controller 241d can flow into the second gas supply pipe 248b from the second nitrogen gas supply pipe 245b and be supplied into the process chamber 201 through the second gas supply holes 234b of the second nozzle 233b.

During the DCS supply process, the exhaust valve 243 is kept closed, and thus the inside pressure of the process chamber 201 is rapidly increased by the DCS gas and $N_2$ gas introduced into the process chamber 201 (refer to the time t1 in FIG. 3). The DCS gas introduced into the process chamber 201 is uniformly diffused and reaches the wafers 200 placed in the boat 217 so that amorphous SiHCl can be formed on the wafers 200 or DCS can be absorbed on the wafers 200. In the DCS supply process, the temperature of the heater 207 is set such that the temperature of the wafers 200 can be kept in the range from 550° C. to 700° C., for example, at 630° C. In addition, for example, it may be preferable that the supply amount of DCS gas is set in the range from 60 cc to 300 cc and the process time of the DCS supply process is set to in the range from 2 seconds to 6 seconds. Furthermore, in the film forming process, it may be preferable that the inside pressure of the process chamber 201 is set, for example, in the range from 20 Pa to 1330 Pa.

(2) $N_2$ Purge Process

The on-off valve V2 of the first gas supply pipe 248a is closed to stop supply of DCS gas. Furthermore, in a state where the on-off valve V4 of the second nitrogen gas supply pipe 245b is opened, $N_2$ gas is supplied into the process chamber 201 through the second gas supply pipe 248b, and along with this, the on-off valve V3 of the first nitrogen gas supply pipe 245a is opened to supply $N_2$ gas the flow rate of which is controlled by the mass flow controller 241c into the process chamber 201 through the first nitrogen gas supply pipe 245a, the first gas supply pipe 248a, and the first nozzle 233a. Furthermore, in the $N_2$ purge process, in a state where the exhaust valve 243 of the exhaust pipe 231 is opened, the inside of the process chamber 201 is evacuated to a low pressure (for example, about 30 Pa or lower) by using vacuum pump 246 (refer to the time t2 of FIG. 3). By the vacuum evacuation of the inside of the process chamber 201 and supply of $N_2$ gas into the process chamber 201, remaining DCS can be removed from the inside of the process chamber 201 and the insides of pipe systems (e.g., the first gas supply pipe 248a and the first nozzle 233a). For example, it may be preferable that the process time of the $N_2$ purge process is set in the range from 3 seconds to 9 seconds.

(3) $NH_3$ Supply Process

In the $NH_3$ supply process of the current embodiment, the inside of the process chamber 201 is not kept at a constant pressure (for example, about 60 Pa to 70 Pa) unlike the above-described conventional art. That is, the $NH_3$ supply process of the current embodiment is characterized in that the pressure ($NH_3$ gas pressure) inside the process chamber 201 is largely varied.

In detail, in the $NH_3$ supply process, switching between an exhaust stop state and an exhaust operation state is performed at least once to largely vary the inside pressure of the process chamber 201 (for example, the inside pressure is varied between 10 P and 1330 Pa, and the pressure difference between the exhaust stop state and the exhaust operation state is set to a large value). Alternatively, in the $NH_3$ supply process, a pressure increasing and decreasing treatment is performed by repeating a pressure increasing operation and a pressure decreasing operation at least once, respectively. The pressure increasing operation is performed to increase the inside pressure of the process chamber 201, for example, from a pressure equal to or lower than 100 Pa to a pressure equal to or higher than 950 Pa; and the pressure decreasing operation is performed to decrease the inside pressure of the process chamber 201, for example, to a pressure equal to or lower than 100 Pa. In the $NH_3$ supply process, the inside pressure of the process chamber 201 is varied so that the maximum inside pressure of the process chamber 201 is greater than the minimum inside pressure of the process chamber 201 by twenty or more times, for example, twenty times. As the difference between the maximum and minimum pressures is increased, or the execution number of the pressure increasing and decreasing treatment is increased, the above-described problems caused by insufficient nitriding in the $NH_3$ supply process may be difficult to occur. The upper and lower limits of pressure are determined mainly by the performance of a pump and the conductance of an exhaust pipe. That is, in either the case where the upper limit of pressure is excessively high or the case where the lower limit of the pressure is excessively low, it may take more time to perform the next pressure decreasing operation, and thus the productivity may be decreased. It is proper that the inside pressure of the process chamber 201 ranges from about 10 Pa to about 1330 Pa.

Next, an explanation will be given on the case where the $NH_3$ supply process is performed through a pressure increasing and decreasing treatment by repeating the pressure increasing operation and the pressure decreasing operation at least once, respectively.

<Pressure Increasing Operation>

The on-off valve V5 of the second gas supply pipe 248b is opened so that $NH_3$ gas the flow rate of which is controlled by the mass flow controller 241b can be supplied into the process chamber 201 through the second gas supply pipe 248b and the second nozzle 233b. In the $NH_3$ supply process (the same in the next pressure decreasing operation), in a state where the on-off valve V5 is opened, $NH_3$ gas is supplied into the process chamber 201. Furthermore, the on-off valve V4 of the second nitrogen gas supply pipe 245b is closed to stop supply of $N_2$ gas into the process chamber 201 through the second gas supply pipe 248b and the second nozzle 233b, and in a state where the on-off valve V3 of the first nitrogen gas supply pipe 245a is kept opened, $N_2$ gas is supplied into the process chamber 201 through the first gas supply pipe 248a and the first nozzle 233a. Furthermore, in the pressure increasing operation of the $NH_3$ supply process, the inside of the process chamber 201 is vacuum-evacuated by using the vacuum pump 246 in a state where the exhaust valve 243 of the exhaust pipe 231 is kept closed. Therefore, in the pressure increasing operation, $NH_3$ gas and $N_2$ gas are filled in the process chamber 201 which was kept at a low pressure by the previous $N_2$ purge process, so as to rapidly increase the inside pressure of the process chamber 201 (refer to a pressure rising time (6 second to 11 seconds) in the period t3 of the example shown in FIG. 3). It is preferable that the inside pressure of the process chamber 201 is adjusted, for example, in the range from 950 Pa to 1330 Pa.

The $NH_3$ gas introduced into the process chamber 201 is diffused throughout the inside of the process chamber 201 and is supplied to the wafers 200 placed in the boat 217. The supplied $NH_3$ gas nitrides the amorphous SiHCl formed on the wafers 200 or the DCS adsorbed on the wafers 200 in the previous DCS supply process, so that amorphous silicon nitride films (such as $Si_3N_4$ films and SiN films) can be formed. For example, the following chemical reaction occurs on the amorphous SiHCl formed on the wafers 200 so that $Si_3N_4$ films are formed.

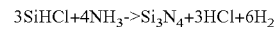

In the process chamber 201, in addition to formation of the silicon nitride films, byproducts are also formed. For example, $NH_4Cl$ may be formed by the following chemical reaction.

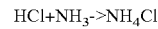

In the $NH_3$ supply process (including the pressure increasing operation and the pressure decreasing operation), the temperature of the heater 207 is set such that the temperature of the wafers 200 can be kept in the range from 550° C. to 700° C., for example, at 630° C. In addition, it may be preferable that the supply flow rate of $NH_3$ is set, for example, in the range from 2 slm to 10 slm.

Furthermore, in the $NH_3$ supply process, the on-off valves V1 of the first gas supply pipe 248a is opened and the on-off valve V2 of the first gas supply pipe 248a is closed to previously store DCS gas in the buffer tank 250 for the next DCS supply process.

<Pressure Decreasing Operation>

In the pressure decreasing operation for decreasing the inside pressure of the process chamber 201, the exhaust valve 243 of the exhaust pipe 231 is opened, and the inside of the process chamber 201 is vacuum-evacuated by using the vacuum pump 246. Other film forming conditions are the same as those of the pressure increasing operation.

Owing to the vacuum evacuation in the pressure decreasing operation, the inside pressure of the process chamber 201 can be rapidly decreased (refer to a pressure falling time (11 seconds to 13 seconds) in the period t3 of the example shown in FIG. 3). It is preferable that the inside pressure of the process chamber 201 is adjusted to 100 Pa or lower, for example, within the range of 10 Pa to 30 Pa.

Since the inside of the process chamber 201 is vacuum-evacuated, byproducts such as $NH_4Cl$ produced by the chemical reaction can be efficiently exhausted and removed from the inside of the process chamber 201. Furthermore, silicon nitride films grow on the wafers 200 in the pressure decreasing operation.

In this way, the pressure increasing and decreasing treatment is performed by repeating the pressure increasing operation and the pressure decreasing operation. In the pressure increasing and decreasing treatment, the pressure increasing operation and the pressure decreasing operation are performed at least once, respectively. For example, after the pressure increasing operation and the pressure decreasing operation are first performed, the pressure increasing operation and the pressure decreasing operation may be performed any number of times (in the example shown in FIG. 3, after the pressure increasing operation and the pressure decreasing operation are first performed, the pressure increasing operation is performed for the second time). It may be preferable that the process time of the pressure increasing and decreasing treatment is set in the range from 4 seconds to 30 seconds.

After the inside pressure of the process chamber 201 is increased to a relatively high-pressure range by the pressure increasing operation, a constant pressure treatment may be performed by controlling the degree of opening of the exhaust valve 243 to keep the inside of the process chamber 201 at a constant pressure in the relatively high-pressure range. Alternatively, after the inside pressure of the process chamber 201 is decreased to a relatively low-pressure range by the pressure decreasing operation, a constant pressure treatment may be performed by controlling the degree of opening of the exhaust valve 243 to keep the inside of the process chamber 201 at a constant pressure in the relatively low-pressure range.

(4) $N_2$ Purge Process

The on-off valve V5 of the second gas supply pipe 248b is closed to stop supply of $NH_3$ gas. Furthermore, the on-off valve V4 of the second nitrogen gas supply pipe 245b is opened to supply $N_2$ gas into the process chamber 201 through the second gas supply pipe 248b and second nozzle 233b, and along with this, the on-off valve V3 of the first nitrogen gas supply pipe 245a is opened to supply $N_2$ gas into the process chamber 201 through the first gas supply pipe 248a and the first nozzle 233a. Furthermore, in the $N_2$ purge process, in a state where the exhaust valve 243 of the exhaust pipe 231 is opened, the inside of the process chamber 201 is evacuated to a low pressure (for example, about 30 Pa or lower) by using vacuum pump 246 (refer to the time t4 of FIG. 3). By the vacuum evacuation of the inside of the process chamber 201 and supply of $N_2$ gas into the process chamber 201, remaining $NH_3$ gas can be removed from the inside of the process chamber 201 and the insides of pipe systems (e.g., the second gas supply pipe 248b and the second nozzle 233b). It may be preferable that the process time of the $N_2$ purge process is set in the range from 3 seconds to 9 seconds.

By the film forming process performed according to an atomic layer deposition (ALD) method in which the above-described (1) DCS supply process, (2) $N_2$ purge process, (3) $NH_3$ supply process, and (4) $N_2$ purge process are set as one cycle, silicon nitride films each constituted by one to several atomic layers can be formed on the wafers 200. By repeating the cycle a plurality of times, silicon nitride films having a predetermined thickness can be formed on the wafers 200.

(Finishing Process)

After forming silicon nitride films to a predetermined thickness, the inside of the process chamber 201 is exhausted while supplying $N_2$ gas into the process chamber 201 to purge the inside of the process chamber 201 with the $N_2$ gas. Then, the inside atmosphere of the process chamber 201 is replaced with the $N_2$ gas, and the inside pressure of the process chamber 201 returns to normal pressure.

Thereafter, the seal cap 219 is lowered by the boat elevator to open the bottom side of the reaction tube 203 and unload the boat 217 in which the processed wafers 200 are held to the outside of the reaction tube 203 through the bottom side of the reaction tube 203. Thereafter, the wafers 200 processed through the film forming process are discharged from the boat 217.

[3] Effects of the Current Embodiment

According to the current embodiment, one or more effects can be attained as follows.

(a) According to the current embodiment, in the $NH_3$ supply process, the exhaust valve 243 of the exhaust pipe 231 is switched between opened and closed positions so that switching between an exhaust stop state and an exhaust operation state can be performed at least once to largely vary the inside pressure of the process chamber 201. At this time, the inside pressure of the process chamber 201 is varied so that the maximum inside pressure of the process chamber 201 is greater than the minimum inside pressure of the process chamber 201 by, for example, twenty times. As a result, the deposition rate (growth rate) of silicon nitride films on wafers 200 can be increased in a wide range of temperature. That is, in the $NH_3$ supply process, the inside pressure of the process chamber 201 is not kept at a constant pressure (for example, at about 60 Pa to 70 Pa) unlike the conventional art. That is, an exhaust stop period is set in the $NH_3$ supply process to increase the pressure (concentration) of $NH_3$ gas in the process chamber 201, for example, to a pressure higher 100 Pa, so that chemical reaction can be facilitated in a wide range of temperature to increase the deposition rate of silicon nitride films and the productivity (refer to Example 1 and Example 2 described later).

(b) According to the current embodiment, in the $NH_3$ supply process, the inside pressure of the process chamber 201 is largely varied so that the thickness uniformity of silicon nitride films can be improved between wafers 200 and in the surfaces of the wafers 200 in a wide range of temperature. That is, an exhaust stop period is set in the $NH_3$ supply process to increase the pressure (concentration) of $NH_3$ gas in the process chamber 201, for example, to a pressure higher 100 Pa, so that supply of $NH_3$ can be facilitated between stacked wafers 200 to improve the thickness uniformity of silicon nitride films between the wafers 200 and in the surfaces of the wafers 200 in a wide range of temperature (refer to Example 1 and Example 3 described later).

(c) According to the current embodiment, the inside pressure of the process chamber 201 is largely varied in the $NH_3$ supply process so that the thickness uniformity of silicon nitride films formed on wafers 200 can be improved between the wafers 200 and in the surfaces of the wafers 200 in a wide range of temperature. That is, an exhaust stop period is set in the $NH_3$ supply process to increase the pressure (concentration) of $NH_3$ gas in the process chamber 201, for example, to a pressure higher 100 Pa, so that nitriding of silicon nitride films can be facilitated. Therefore, for example, the insulating quality of the silicon nitride films can be improved in a wide range of temperature (refer to Example 4 described later).

(d) According to the current embodiment, the inside pressure of the process chamber 201 is largely varied in the $NH_3$ supply process, so that byproducts (for example, $NH_4Cl$) generated by chemical reaction can be efficiently exhausted. Therefore, the amount of particles can be reduced in the process chamber 201, and permeation of byproducts into silicon nitride films can be prevented to improve the quality of the silicon nitride films.

(e) According to the current embodiment, in the $NH_3$ supply process, the exhaust valve 243 of the exhaust pipe 231 is switched between opened and closed positions to vary the inside pressure of the process chamber 201, so that clogging of an exhaust system can be prevented. That is, when and immediately after the $NH_3$ supply process is started, the exhaust valve 243 is kept closed, and after the inside pressure of the process chamber 201 is increased to a predetermined value, the exhaust valve 243 is opened to decrease the inside pressure of the process chamber 201, so that mixing of DCS and $NH_3$ can be prevented in the exhaust system and clogging of the exhaust system can be prevented (refer to Example 5 described later).

(f) According to the current embodiment, the supply flow rate of $NH_3$ into the process chamber 201 can be reduced. That is, in the $NH_3$ supply process, the exhaust valve 243 is not always kept opened but the exhaust valve 243 is closed to increase the inside pressure of the process chamber 201 in the pressure increasing operation. Therefore, for example, although the supply flow rate of $NH_3$ into the process chamber 201 is decreased, nitriding can be surely performed by $NH_3$, and $NH_3$ can be surely adsorbed on the surfaces of wafers 200. For example, referring to FIG. 7A and FIG. 7B, if the supply flow rate of $NH_3$ gas into a process chamber is, for example, 10 slm in a comparative example, the supply flow rate of $NH_3$ gas into the process chamber can be reduced to, for example, 5.5 slm in an example of the present invention. Therefore, $NH_3$ is not wasted, and thus substrate processing costs can be reduced.

(g) According to the current embodiment, the supply flow rate of $NH_3$ into the process chamber 201 can be reduced, and thus the in-surface temperature uniformity of wafers 200 can be improved in the $NH_3$ supply process. In this way, the in-surface thickness and quality uniformities of silicon nitride films can be improved.

Figure 8B:
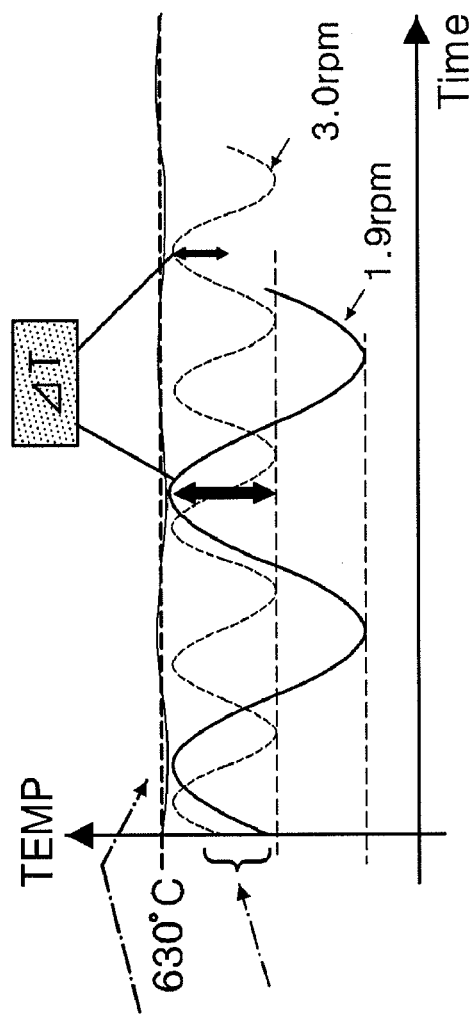
FIG. 8A through FIG. 8D are schematic views illustrating a decreasing in-surface temperature uniformity of a substrate in accordance to an increasing supply flow rate of $NH_3$ gas into a process chamber.
Figure 8A:
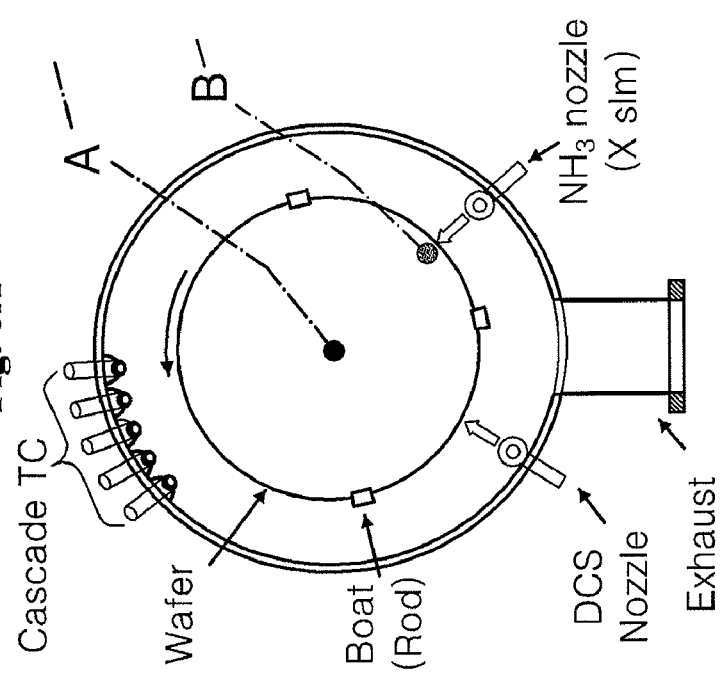
Figure 8D:
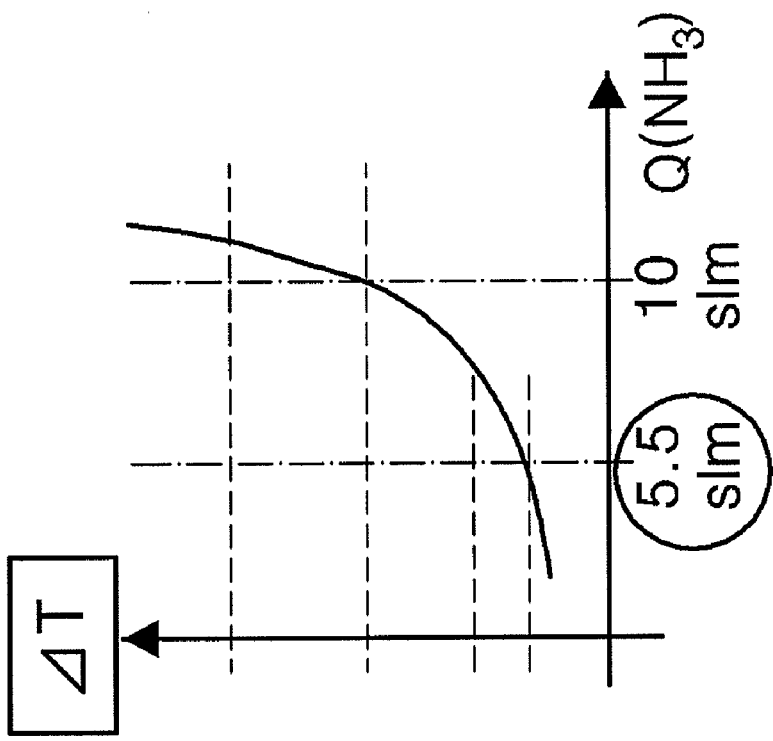
Figure 8C:
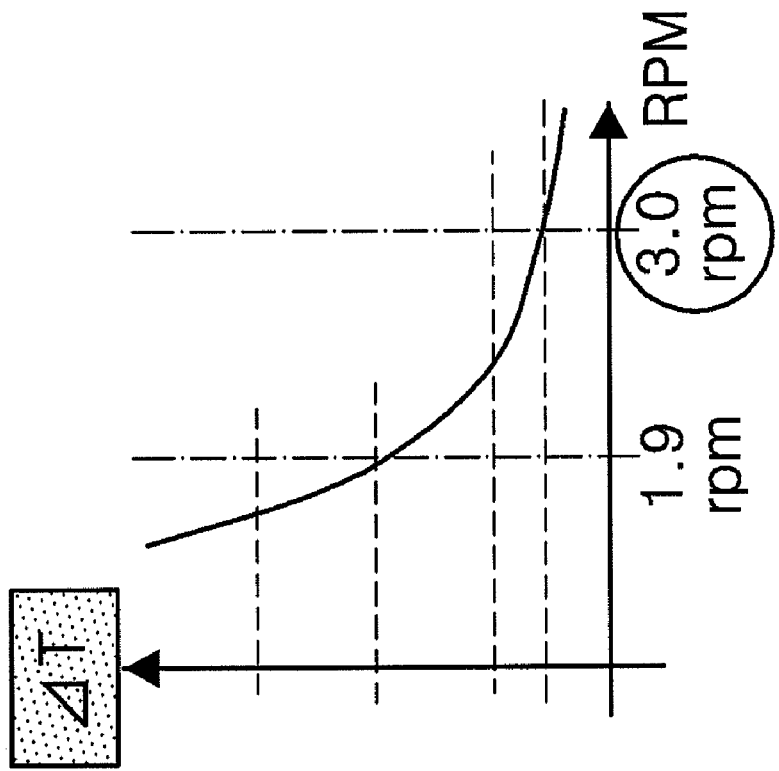

FIG. 8A through FIG. 8D are schematic views illustrating a decreasing in-surface temperature uniformity of a substrate in accordance to an increasing supply flow rate of $NH_3$ gas into a process chamber. As shown in FIG. 8A, an edge part B of a wafer placed in the process chamber is locally cooled by $NH_3$ gas supplied from a $NH_3$ nozzle. Therefore, the temperature of the edge part B is locally decreased as compared with the temperature of a center part A. Thus, if a heater (cascade TC) is installed at a position opposite to the $NH_3$ nozzle, as shown in FIG. 8B, the temperature of the edge part B oscillates with a temperature amplitude of $\Delta T$ in accordance with the rotation period of the wafer. As shown in FIG. 8C, the temperature amplitude $\Delta T$ can be reduced in some degree by increasing the rotation speed of the wafer (for example, from 1.9 rpm to 3.0 rpm). However, as shown in FIG. 8D, if the supply flow rate of $NH_3$ gas is increased (for example, from 5 slm to 10 slm), the temperature amplitude $\Delta T$ may be increased to a non-negligible level. If the temperature amplitude $\Delta T$ of the edge part B is increased, the in-surface thickness uniformity or quality of a silicon nitride film formed on the wafer may be deteriorated. For example, if the temperature amplitude $\Delta T$ is increased, haze growth may occur near the edge part B. In addition, if the temperature amplitude $\Delta T$ is increased, the wafer may expand and contract largely, and thus, for example, the wafer may graze rods of a boat more frequently. This may increase generation of particles.

However, according to the current embodiment, since the supply flow rate of $NH_3$ into the process chamber 201 can be reduced (while guaranteeing nitriding by $NH_3$ and adsorption of $NH_3$ on the surfaces of wafers 200 although the supply flow rate of $NH_3$ is reduced), the amplitude $\Delta T$ of temperature oscillation of the edge parts of the wafers 200 can be reduced, and thus the above-mentioned problems can be solved.

Other Embodiments of the Present Invention

While the present invention has been particularly described with reference to the embodiment, the present invention is not limited to the embodiment, but various changes and modifications may be made in the present invention without departing from the scope of the invention.

For example, ammonia gas is supplied into the process chamber 201 in a non-plasma state in the previous embodiment. However, high-frequency electrodes may be installed near the second nozzle 233b in the process chamber 201 to supply plasma-state ammonia gas to wafers 200 disposed in the process chamber 201. By exciting ammonia gas into plasma, the substrate process temperature or the supply time of ammonia gas can be reduced.

In addition, for example, another silicon-containing gas may be alternatively used as a source gas instead of using DCS gas. For example, one of the following gases may be used as a source gas: inorganic source gases such as hexachlorodisilane ($Si_2Cl_6$, abbreviation: HCD) gas, tetrachlorosilane ($SiCl_4$, abbreviation: TCS) gas, and monosilane ($SiH_4$) gas; organic source gases such as aminosilane-based tetrakisdimethylaminosilane ($Si(N(CH_3)_2))_4$, abbreviation: 4DMAS) gas, trisdimethylaminosilane ($Si(N(CH_3)_2)_3H$, abbreviation: 3DMAS) gas, bisdiethylaminosilane ($Si(N(C_2H_5)_2)_2H_2$, abbreviation: 2DEAS) gas, and bistertiarybutylaminosilane ($SiH_2(NH(C_4H_9))_2$, abbreviation: BTBAS) gas; and a mixture gas including one of them. Instead of $NH_3$ gas, another nitrogen-containing gas (nitriding agent) may be used as a reaction gas. For example, a nitrogen-containing gas such as $N_2O$ gas or $NO_2$ gas, or a mixture gas including one of them may be used as a reaction gas. Instead of $N_2$ gas, a rare gas such as Ar gas, He gas, Ne gas, and Xe gas may be used as an inert gas.

EXAMPLES

Next, specific examples of the present invention will be explained.

Example 1

By using the substrate processing apparatus shown in FIG. 1, a silicon nitride film was formed on a wafer by an ALD method. Like in the previous embodiment, a silicon nitride film forming process was performed through a cycle treatment by repeating, a plurality of times, a cycle of (1) DCS supply process, (2) $N_2$ purge process, (3) $NH_3$ supply process, and (4) $N_2$ purge process.

FIG. 3 illustrates pressure variations in the process chamber 201 during a cycle. Referring to FIG. 3, a time (period) t1 corresponds to (1) DCS supply process, a time (period) t2 corresponds to (2) $N_2$ purge process, a time t3 (period) corresponds to (3) $NH_3$ supply process, and a time (period) t4 corresponds to (4) $N_2$ purge process.

In the example, as shown by a solid line in FIG. 3, in the $NH_3$ supply process (time t3), a first pressure increasing operation (for 5 seconds from 6 sec to 11 sec), a pressure decreasing operation (for 2 seconds from 11 sec to 13 sec), and a second pressure increasing operation (for 5 seconds from 13 sec to 18 sec) were sequentially performed. For example, in a conventional example for comparing with the example, as shown by a broken line in FIG. 3, in a $NH_3$ supply process, the inside pressure of the process chamber 201 was kept constant by controlling the degree of opening of the exhaust valve 243 of the exhaust pipe 231. Furthermore, in a comparative example, as shown by a dotted and dashed line in FIG. 3, a NH$_3$ supply process was performed in an exhaust stop state by keeping the exhaust valve 243 of the exhaust pipe 231 in a closed state.

Table 1 below shows DCS gas supply amounts in the period t1, NH$_3$ gas supply flow rates in the period t3, N$_2$ gas supply flow rates in each of the periods t1 to t4, and N$_2$ gas supply flow rates from the R-unit nozzle during the periods t1 to t4 for the cases of the example, the conventional example, and the comparative example. In addition, Table 2 below shows opening and closing states of the on-off valves V1 to V5 and the exhaust valve 243 in each of the periods t1 to t4 for the cases of the example, the conventional example, and the comparative example. In addition, Table 3 (the part "Table 3 (below)" in Table 2) shows opening and closing states of the on-off valves V1 to V5 and the exhaust valve 243 in the period t3 of the example.

TABLE 1

| Gases | Units | Time | Nozzle | Conventional | Example | Comparative Example |
|---|---|---|---|---|---|---|
| DCS | cc/cycle | t1 | 1$^{st}$ nozzle | | 133 | |
| NH$_3$ | SLM | t3 | 2$^{nd}$ nozzle | 10 | 6 | 2 |
| N$_2$ | SLM | t1 | 1$^{st}$ nozzle | | 0 | |
| | | t2 | | | 1 | |
| | | t3 | | | | |
| | | t4 | | | | |
| | | t1 | 2$^{nd}$ nozzle | | 1.5 | |
| | | t2 | | | | |
| | | t3 | | | 0 | |
| | | t4 | | | 1.5 | |
| | | t1-t4 | R-Unit | | 0.3 | |

TABLE 2

| Period (time) | Nozzle | Conventional | Example | Comparative Example |
|---|---|---|---|---|
| t1 (2 sec) | v1 | | Close | |
| | v2 | | Open | |
| | v3 | | Close | |
| | v4 | | Open | |
| | v5 | | Close | |
| | Exhaustion | | Close | |
| t2 (4 sec) | v1 | | Close | |
| | v2 | | Close | |
| | v3 | | Open | |
| | v4 | | Open | |
| | v5 | | Close | |
| | Exhaustion | | Open | |
| t3 (12 sec) | v1 | Open | Table 3 (below) | Open |
| | v2 | Close | | Close |
| | v3 | Open | | Open |
| | v4 | Close | | Close |
| | v5 | Open | | Open |
| | Exhaustion | Open | | Close |
| t4 (3 sec) | v1 | | Close | |
| | v2 | | Close | |
| | v3 | | Open | |
| | v4 | | Open | |
| | v5 | | Close | |
| | Exhaustion | | Open | |

TABLE 3

| Period | Nozzle | Example |
|---|---|---|
| t3 (12 sec) | Pressure increasing operation (5 sec) | v1 | Open |
| | v2 | Close |
| | v3 | Open |
| | v4 | Close |
| | v5 | Open |
| | Exhaustion | Close |
| Pressure decreasing operation (2 sec) | v1 | Open |
| | v2 | Close |
| | v3 | Open |
| | v4 | Close |
| | v5 | Open |
| | Exhaustion | Open |
| Pressure increasing operation (5 sec) | v1 | Open |
| | v2 | Close |
| | v3 | Open |
| | v4 | Close |
| | v5 | Open |
| | Exhaustion | Close |

Referring to Table 2 and Table 3, in the example, the conventional example, and the comparative example, the opening and closing states of the valves are different only in the period t3 of the NH$_3$ supply process and are the same in the DCS supply process and the N$_2$ purge processes. In addition, as shown in Table 1, in the example, the conventional example, and the comparative example, the supply flow rates or supply amounts of gases are only different in the period t3 (the supply flow rates of NH$_3$ gas are different) and are the same in the other cases.

Table 4 below shows results of silicon nitride film formation. As shown in Table 4, substrate (wafer) temperature was kept at a constant value in the range from 500° C. to 650° C. during film forming processes, the time of one cycle was 21 seconds (as shown in FIG. 3 and Table 2, the sum of t1 (2 seconds), t2 (4 seconds), t3 (12 seconds), and t4 (3 seconds) is 21 seconds), and the cycle was performed 727 times.

TABLE 4

| Items | Units | Conventional | Example | Comparative Example |
|---|---|---|---|---|
| Substrate temperature | ° C. | | 500° C. to 650° C. | |
| Cycle number | Cycle | | 727 | |
| Time per cycle | Seconds | | 21 | |
| Average film thickness | Å | 474.9 | 535.86 | 413.18 |
| Film thickness uniformity in surface of substrate | % | 2.42 | 1.42 | 3.04 |
| Deposition rate | Å/cycle | 0.65 | 0.74 | 0.57 |
| | Å/min | 1.87 | 2.11 | 1.62 |
| Improvement of deposition rate | % | (Reference) | 13 | — |
| Rating | | — | Good | Bad |

As shown in Table 4, in the case of the comparative example where the pressure of NH$_3$ gas in the process chamber 201 was merely increased by maintaining an exhaust stop state in the NH$_3$ supply process, the film thickness uniformity in the surface of a substrate was deteriorated as compared with even the conventional example. However, in the case of the example where the inside pressure of the process chamber 201 was largely varied in the NH$_3$ supply process, the film thickness uniformity in the surface of a substrate was improved due to uniform supply of NH$_3$ gas in the process chamber 201, and the deposition rate of a silicon nitride film was also increased. The deposition rate of the silicon nitride film could be increased by 13% as compared with the conventional example. In addition, it is considered that byproducts generated by chemical reaction could be efficiently exhausted. Thus, by preventing generation of byproducts/contaminants in this way, the maintenance frequency of the substrate processing apparatus may be reduced, for example, by a factor of two or more.

The results of the example shows the effectiveness of a pressure increasing and decreasing treatment in which a pressure increasing operation and a pressure decreasing operation are repeated. The advantageous effects may be increased, as the inside pressure of the process chamber 201 is varied more frequently by the pressure increasing and decreasing treatment, and as the pressure variation width is increased.

Example 2

By using the substrate processing apparatus shown in FIG. 1, a silicon nitride film was formed on a wafer by an ALD method. Like in the previous embodiment, a silicon nitride film forming process was performed through a cycle treatment by repeating, a plurality of times, a cycle of (1) DCS supply process, (2) $N_2$ purge process, (3) $NH_3$ supply process, and (4) $N_2$ purge process.

Figure 4A:
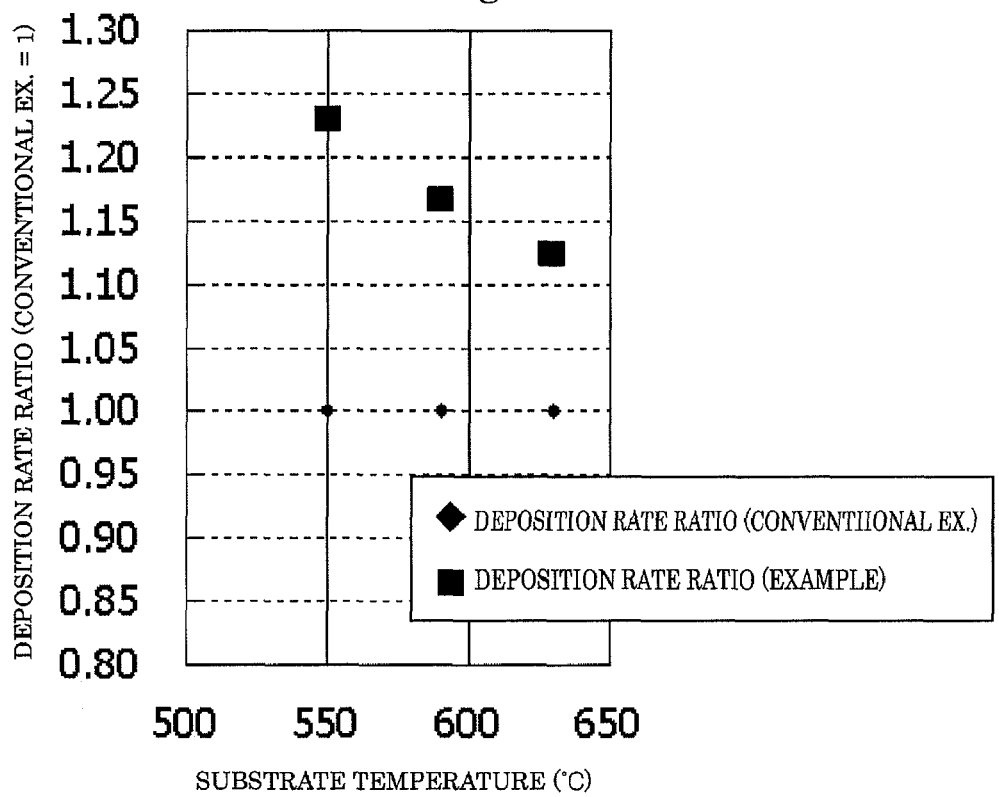
FIG. 4A and FIG. 4B are exemplary graphs illustrating the rate of deposition increased by varying pressure in a $NH_3$ supply process, in which the horizontal axis of FIG. 4A denotes temperature in Celsius degrees (° C.) and the horizontal axis of FIG. 4B denotes the reciprocal of Fahrenheit temperature ($K^{-1}$).
Figure 4B:
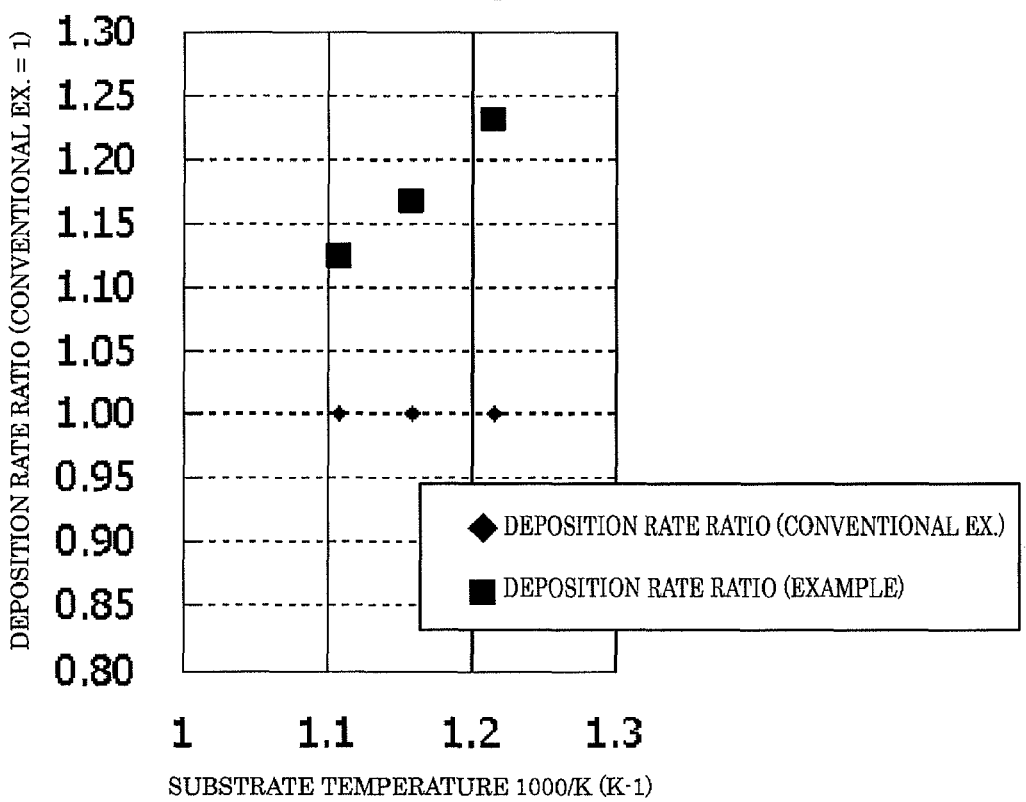

FIG. 4A and FIG. 4B are exemplary graphs illustrating the deposition rate of a silicon nitride film increased by varying pressure in a $NH_3$ supply process, in which the horizontal axis of FIG. 4A denotes temperature in Celsius degrees (° C.) and the horizontal axis of FIG. 4B denotes the reciprocal of Fahrenheit temperature ($K^{-1}$). The vertical axes of FIG. 4A and FIG. 4B denote deposition rate ratios when silicon nitride films are formed. That is, each vertical axis denotes a ratio of a deposition rate of the example to a deposition rate of a comparative example (where a silicon nitride film was formed while not varying the inside pressure of the process chamber 201 in a $NH_3$ supply process). A larger ratio in the vertical axis means a larger deposition rate as compared with the conventional example. In FIG. 4A and FIG. 4B, the deposition rate of the example (where a silicon nitride film was formed while varying the inside pressure of the process chamber 201 in a $NH_3$ supply process) is denoted by a symbol ■, and the deposition rate of the conventional example is denoted by a symbol ♦.

As shown in FIG. 4A and FIG. 4B, in the example (■) where the inside pressure of the process chamber 201 was varied in the $NH_3$ supply process, the deposition rate of a silicon nitride film was increased in a wide range of temperature (550° C., 600° C., 650° C.) as compared with the conventional example (♦) where pressure was not varied. That is, it can be understood that the deposition rate of a silicon nitride film can be increased in a wide range of temperature by varying pressure in a $NH_3$ supply process. By varying the pressure of $NH_3$ supplied to the process chamber 201, nitriding by the $NH_3$ supplied to the surface of a wafer and adsorption of the $NH_3$ on the surface of the wafer may be done more efficiently as compared with the comparative example or conventional example, and thus the above-described effect may be obtained. In addition, as shown in FIG. 4A and FIG. 4B, when the temperature of a wafer is low (for example, 550° C.), the deposition rate ratio is large.

Example 3

By using the substrate processing apparatus shown in FIG. 1, a silicon nitride film was formed on a wafer by an ALD method. Like in the previous embodiment, a silicon nitride film forming process was performed through a cycle treatment by repeating, a plurality of times, a cycle of (1) DCS supply process, (2) $N_2$ purge process, (3) $NH_3$ supply process, and (4) $N_2$ purge process.

Figure 5A:
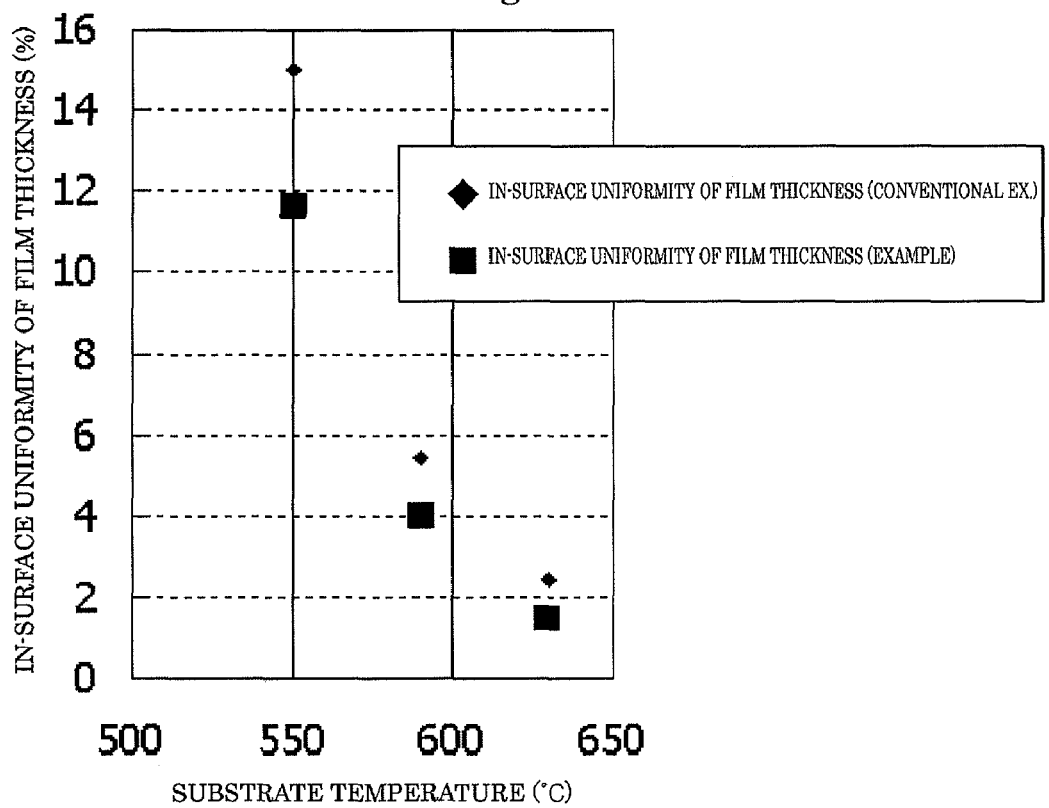
FIG. 5A and FIG. 5B are exemplary graphs illustrating the in-surface thickness uniformities of silicon nitride films, in which the horizontal axis of FIG. 5A denotes temperature in Celsius degrees (° C.) and the horizontal axis of FIG. 5B denotes the reciprocal of Fahrenheit temperature ($K^{-1}$).
Figure 5B:
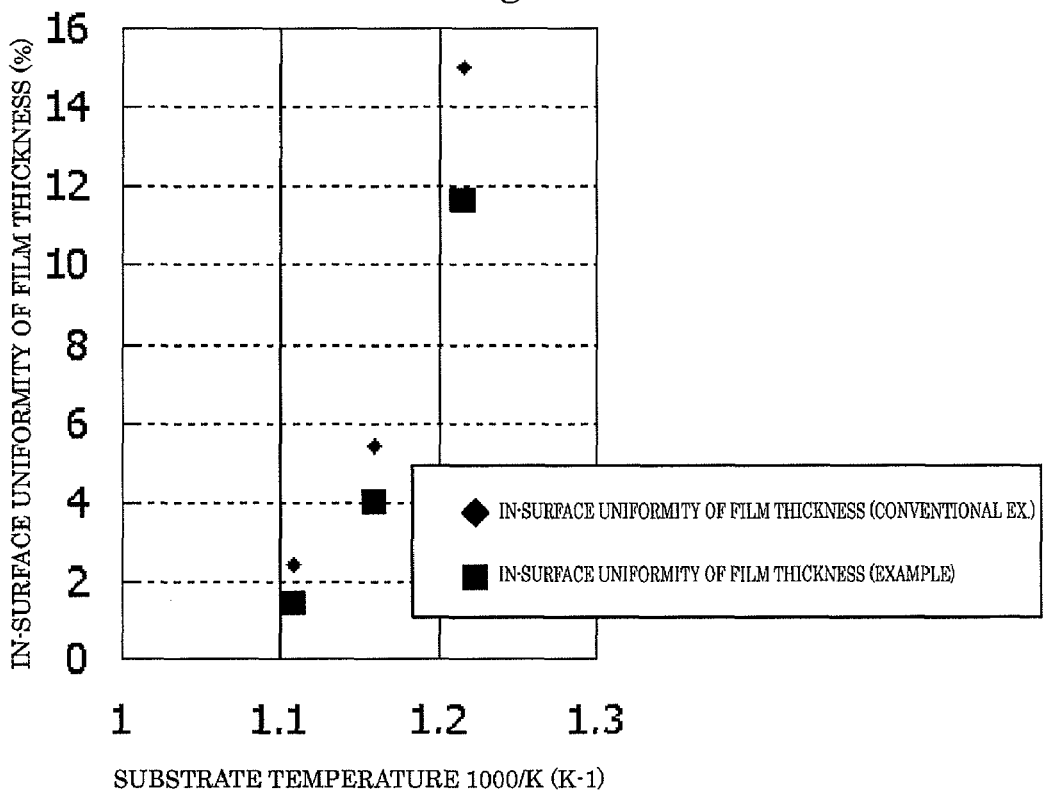

FIG. 5A and FIG. 5B are exemplary graphs illustrating the in-surface thickness uniformities of silicon nitride films improved by varying pressure in a $NH_3$ supply process, in which the horizontal axis of FIG. 5A denotes temperature in Celsius degrees (° C.) and the horizontal axis of FIG. 5B denotes the reciprocal of Fahrenheit temperature ($K^{-1}$). The vertical axes of FIG. 5A and FIG. 5B denote the in-surface uniformities (%) of thicknesses of silicon nitride films. A lower value in the vertical axis means a better in-surface uniformity. In FIG. 5A and FIG. 5B, the in-surface uniformity of the example (where a silicon nitride film was formed while varying the inside pressure of the process chamber 201 in a $NH_3$ supply process) is denoted by a symbol ■, and the in-surface uniformity of a conventional example is denoted by a symbol ♦ (where a silicon nitride film was formed while not varying the inside pressure of the process chamber 201 in a $NH_3$ supply process).

As shown in FIG. 5A and FIG. 5B, in the example where the inside pressure of the process chamber 201 was varied in the $NH_3$ supply process, the in-surface thickness uniformity of a silicon nitride film was improved in a wide range of temperature (550° C., 600° C., 650° C.) as compared with the conventional example where the inside pressure of the process chamber 201 was not varied. That is, it can be understood that the in-surface thickness uniformity of a silicon nitride film can be improved in a wide range of temperature by varying pressure in a $NH_3$ supply process. By varying the pressure of $NH_3$ supplied to the process chamber 201, nitriding by the $NH_3$ supplied to the surface of a wafer and adsorption of $NH_3$ on the surface of the wafer may be done with improved in-surface uniformity as compared with the conventional example, and thus the above-described effect may be obtained. In addition, as shown in FIG. 5A and FIG. 5B, as the temperature of the wafer is decreased (for example, 550° C.), it may be easier to improve the in-surface uniformity of a film thickness.

Example 4

By using the substrate processing apparatus shown in FIG. 1, a silicon nitride film was formed on a wafer by an ALD method. Like in the previous embodiment, a silicon nitride film forming process was performed through a cycle treatment by repeating, a plurality of times, a cycle of (1) DCS supply process, (2) $N_2$ purge process, (3) $NH_3$ supply process, and (4) $N_2$ purge process.

Figure 6A:
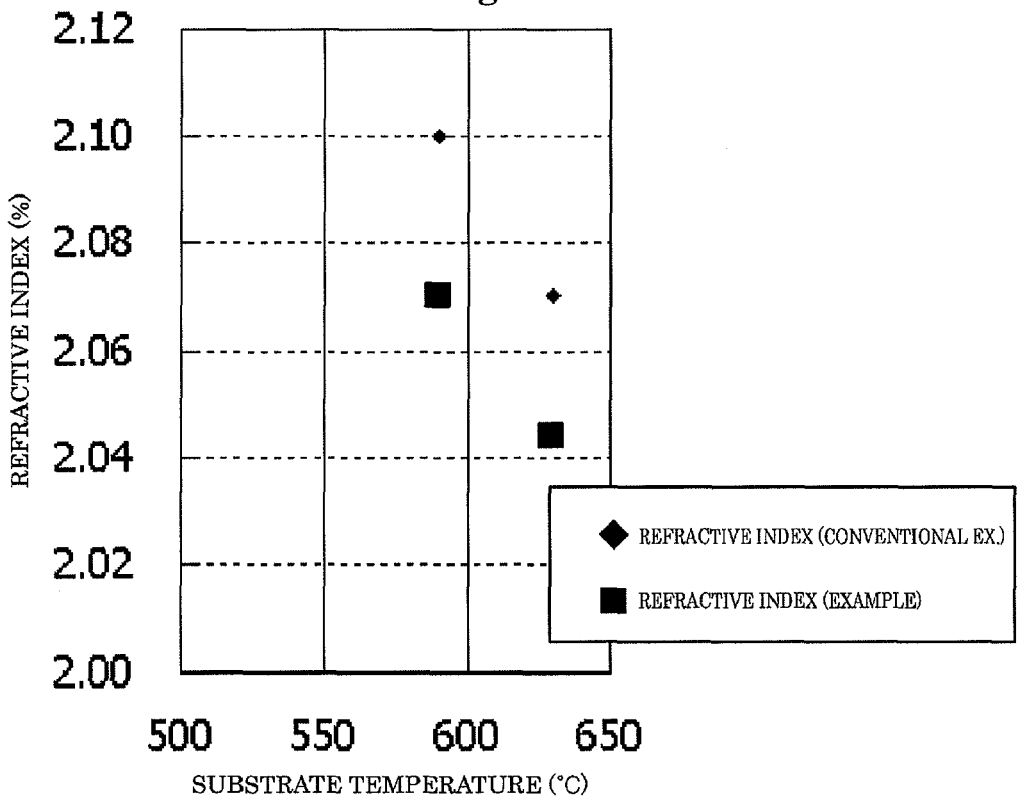
FIG. 6A and FIG. 6B are exemplary graphs illustrating the refractive indexes of silicon nitride films, in which the horizontal axis of FIG. 6A denotes temperature in Celsius degrees (° C.) and the horizontal axis of FIG. 6B denotes the reciprocal of Fahrenheit temperature ($K^{-1}$).
Figure 6B:
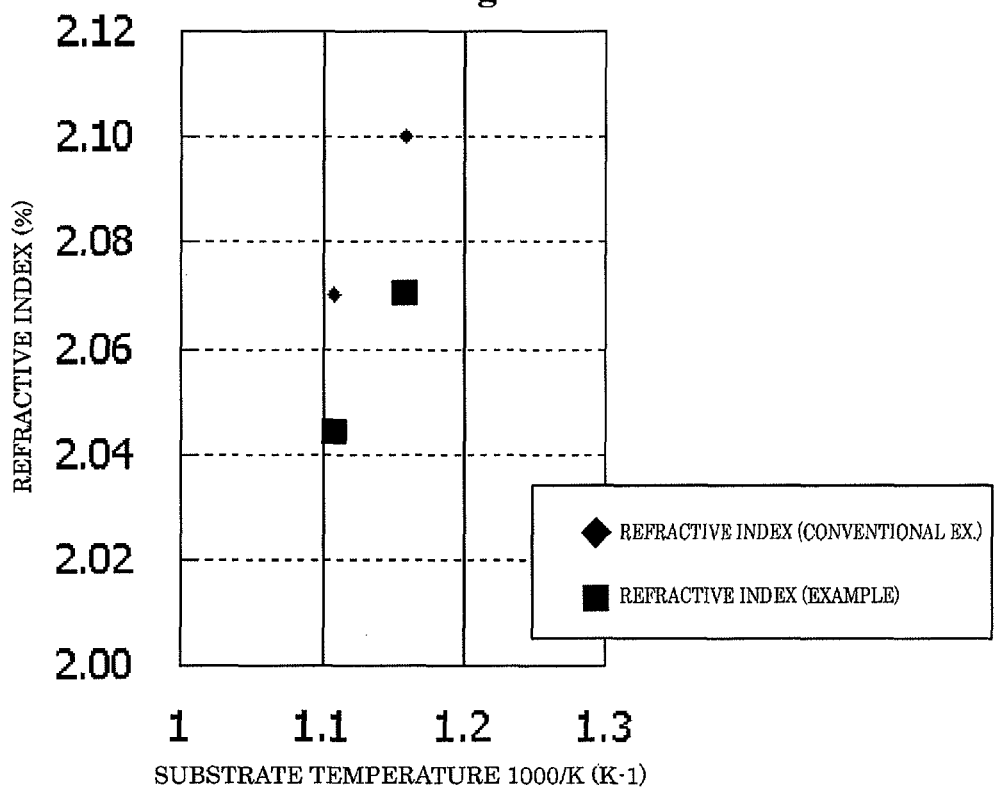

FIG. 6A and FIG. 6B are exemplary graphs illustrating the refractive indexes of silicon nitride films, in which the horizontal axis of FIG. 6A denotes temperature in Celsius degrees (° C.) and the horizontal axis of FIG. 6B denotes the reciprocal of Fahrenheit temperature ($K^{-1}$). The vertical axes of FIG. 6A and FIG. 6B denote the refractive indexes (%) of silicon nitride films. The refractive index of a silicon nitride film having an ideal stoichiometric composition is 2. That is, in FIG. 6A and FIG. 6B, as it goes down in the vertical axes, the composition approaches a stoichiometric composition, and the quality of a film becomes better. In FIG. 6A and FIG. 6B, the refractive index of the example (where a silicon nitride film was formed while varying the inside pressure of the process chamber 201 in a $NH_3$ supply process) is denoted by a symbol ■, and the refractive index of a conventional example is denoted by a symbol ♦ (where a silicon nitride film was formed while not varying the inside pressure of the process chamber 201 in a $NH_3$ supply process).

As shown in FIG. 6A and FIG. 6B, in the example where the inside pressure of the process chamber 201 was varied in the $NH_3$ supply process, the refractive index is closer to 2.0 in a wide range of temperature (550° C., 600° C.) as compared with the conventional example where the inside pressure of the process chamber 201 was not varied. That is, by varying pressure in a $NH_3$ supply process, a silicon nitride film can be surely nitrided, and thus the composition of the silicon nitride film can be close to a stoichiometric composition for high quality (for example, high insulation resistance) in a wide range of temperature.

Example 5

Figure 7B:
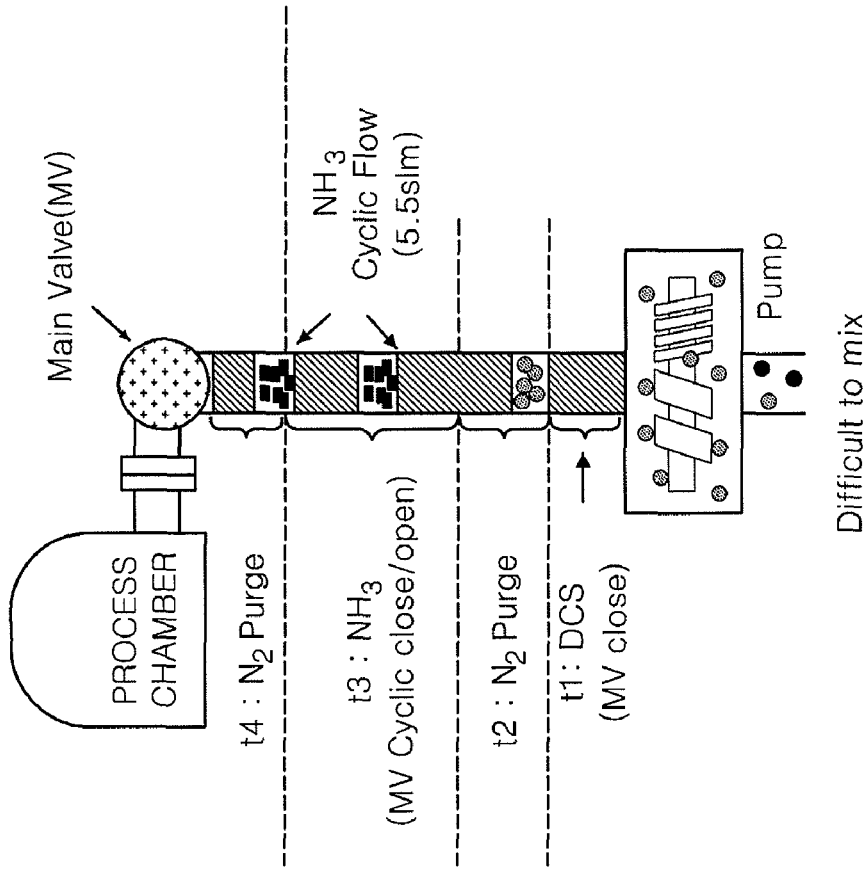
Figure 7A:
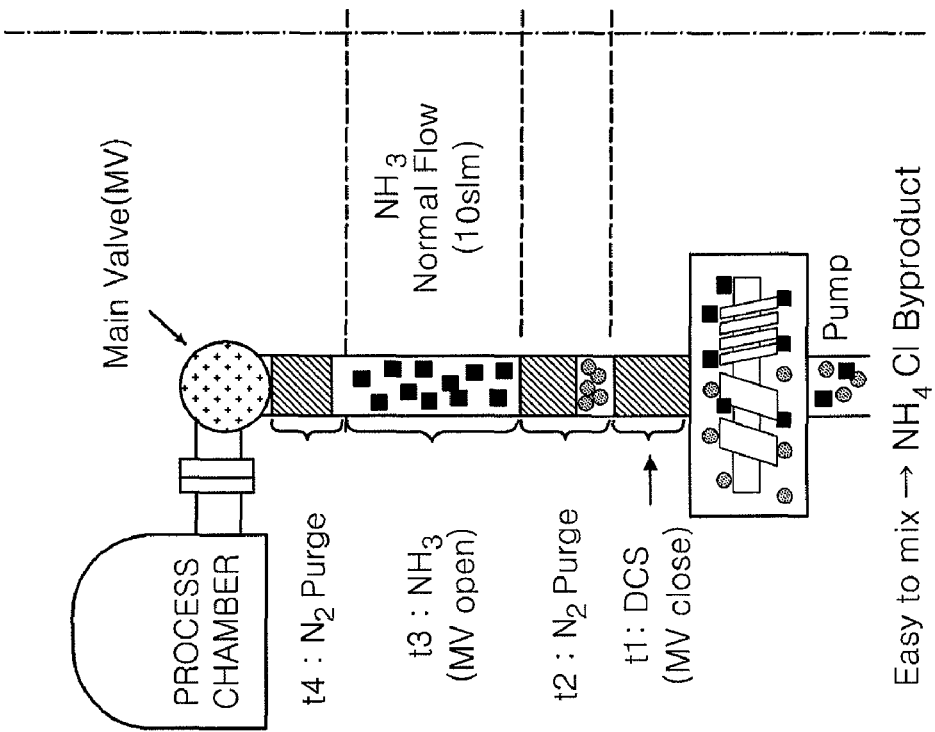

FIG. 7A and FIG. 7B are schematic views illustrating various gases exhausted through an exhaust system, in which FIG. 7A illustrates a comparative example and FIG. 7B illustrates an example. FIG. 7A illustrates a case where an exhaust valve (main valve, MV) of an exhaust pipe was kept opened to perform continuous exhaustion in a $NH_3$ supply process so as not to change the inside pressure of a process chamber (comparative example). FIG. 7B illustrates a case where the exhaust valve (MV) of the exhaust pipe was switched between opened and close positions in a $NH_3$ supply process so as to change the inside pressure of the process chamber (example). In the example, in an early stage of the $NH_3$ supply process, the exhaust valve (MV) was kept closed, and if the inside pressure of the process chamber was increased to a predetermined value, the exhaust valve (MV) was opened to decrease the inside pressure of the process chamber. Thereafter, the exhaust valve (MV) was closed again to increase the inside pressure of the process chamber.

As shown in FIG. 7A and FIG. 7B, in each of the example and the conventional example, if the exhaust valve (MV) is opened to start a $N_2$ purge process (t2), DCS gas flows from the process chamber into the exhaust pipe and the vacuum pump. If DCS gas is exhausted from at least the process chamber, a $NH_3$ supply process (t3) is started to supply $NH_3$ gas into the process chamber at a predetermined flow rate. However, according to the start time of the $NH_3$ supply process (t3), DCS gas may remain in the exhaust pipe or the vacuum pump although DCS gas is completely exhausted from the process chamber. The flow rate of $NH_3$ gas may be set to 10 slm in the conventional example and 5.5 slm in the present invention example.

In the conventional example (FIG. 7A), the $NH_3$ supply process (t3) is performed in a state where the exhaust valve (MV) is kept opened. Therefore, $NH_3$ gas is introduced into the exhaust valve (MV) and the vacuum pump immediately after the $NH_3$ supply process (t3) is started. As a result, according to the start time of the $NH_3$ supply process (t3), DCS remaining in the exhaust pipe and the vacuum pump may be easily mixed with $NH_3$ introduced into the exhaust pipe and the vacuum pump, and thus silicon nitride films or byproducts (for example, $NH_4Cl$) may be easily deposited on the insides of the exhaust pipe and the vacuum pump. That is, since $NH_3$ starts to flow into the exhaust pipe and the vacuum pump somewhat early in the conventional example, the $NH_3$ may flow in the exhaust pipe and the vacuum pump before DCS is completely exhausted, and thus the exhaust system may be easily clogged.

However, in the example (FIG. 7B), the exhaust valve is kept closed at a time immediately after the $NH_3$ supply process (t3) starts, and after the inside pressure of the process chamber is increased to a predetermined value, the exhaust valve (MV) is opened. Therefore, $NH_3$ does not flow into the exhaust pipe and the vacuum pump immediately after the $NH_3$ supply process (t3) starts but starts to flow into the exhaust pipe and the vacuum pump after a predetermined time. As a result, the possibility of DCS and $NH_3$ being mixed in the exhaust pipe and the vacuum pump can be surely reduced. That is, in the example, although the $NH_3$ supply process (t3) starts early, $NH_3$ starts to flow into the exhaust pipe and the vacuum pump at a relatively late time, and thus DCS can be surely exhausted from the exhaust pipe and the vacuum pump before $NH_3$ starts to flow into the exhaust pipe and the vacuum pump. In this way, clogging of the exhaust system can be prevented more surely, and the maintenance frequency of a substrate processing apparatus can be increased.

According to the present invention, a silicon nitride film having better quality can be formed on a substrate.

(Supplementary Note)

The present invention also includes the following preferred embodiments.

(Supplementary Note 1)

According to an embodiment of the present invention, there is provided a method of manufacturing a semiconductor device, the method comprising: supplying a silicon-containing gas into a process chamber in which a substrate is accommodated in a heated state; and supplying a nitrogen-containing gas into the process chamber, wherein the supplying of the silicon-containing gas and the supplying of the nitrogen-containing gas are alternately repeated to form a silicon nitride film on the substrate, wherein the process chamber is switched at least once between an exhaust stop state and an exhaust operation state during the supplying of the nitrogen-containing gas so as to vary an inside pressure of the process chamber in a manner such that the maximum inside pressure of the process chamber is twenty or more times the minimum inside pressure of the process chamber. As the difference between the maximum and minimum pressures is increased, or the execution number of a pressure increasing and decreasing treatment is increased, the above-described problems caused by insufficient nitriding in a $NH_3$ supply process may be difficult to occur. The upper and lower limits of pressure are determined mainly by the performance of a pump and the conductance of an exhaust pipe. That is, in either the case where the upper limit of pressure is excessively high or the case where the lower limit of the pressure is excessively low, it may take more time to perform the next pressure decreasing operation, and thus the productivity may be decreased. It is preferable that the inside pressure of the process chamber ranges from about 10 Pa to about 1330 Pa.

(Supplementary Note 2)

According to another embodiment of the present invention, there is provided a substrate processing apparatus comprising: a process chamber configured to process a substrate; a first gas supply unit configured to supply a silicon-containing gas into the process chamber; a second gas supply unit configured to supply a nitrogen-containing gas into the process chamber; a heater configured to heat the substrate in the process chamber; an exhaust unit configured to exhaust gas from the process chamber; and a controller configured to control the exhaust unit, the first gas supply unit, the second gas supply unit, and the heater, wherein the controller controls supplying a silicon-containing gas into the process chamber and supplying a nitrogen-containing gas into the process chamber so that the supplying of the silicon-containing gas and the supplying of the nitrogen-containing gas are alternately repeated to form a silicon nitride film on the substrate, and the controller controls the supplying of the nitrogen-containing gas to switch the process chamber at least once between an exhaust stop state and an exhaust operation state during the supplying of the nitrogen-containing gas so as to vary an inside pressure of the process chamber in a manner such that the maximum inside pressure of the process chamber is twenty or more times the minimum inside pressure of the process chamber.

(Supplementary Note 3)

According to another embodiment of the present invention, there is provided a method of manufacturing a semiconductor device, the method comprising: supplying a dichlorosilane-containing gas into a process chamber in which a substrate is accommodated in a heated state; and supplying an ammonia-containing gas into the process chamber, wherein the supplying of the dichlorosilane-containing gas and the supplying of the ammonia-containing gas are alternately repeated to form a silicon nitride film on the substrate, wherein the process chamber is switched at least once between an exhaust stop state and an exhaust operation state during the supplying of the ammonia-containing gas so as to vary an inside pressure of the process chamber in a manner such that the maximum inside pressure of the process chamber is twenty or more times the minimum inside pressure of the process chamber.

The inside pressure of the process chamber may be varied, for example, in the range from 10 Pa to 1330 Pa.

(Supplementary Note 4)

According to another embodiment of the present invention, there is provided a method of manufacturing a semiconductor device, the method comprising: supplying a dichlorosilane-containing gas into a process chamber in which a substrate is accommodated in a heated state; and supplying an ammonia-containing gas into the process chamber, wherein the supplying of the dichlorosilane-containing gas and the supplying of the ammonia-containing gas are alternately repeated to form a silicon nitride film on the substrate, wherein the supplying of the ammonia-containing gas comprises: increasing an inside pressure of the process chamber from a pressure equal to or lower than 100 Pa to a pressure equal to or higher than 950 Pa; and after the increasing of the inside pressure of the process chamber, decreasing the inside pressure of the process chamber to a pressure equal to or lower than 100 Pa, wherein the increasing of the inside pressure of the process chamber and the decreasing of the inside pressure of the process chamber are performed at least once.

(Supplementary Note 5)

In the method of Supplementary Note 3 or 4, when the silicon nitride film is formed, the substrate may be kept at a temperature of 630° C. or lower, the deposition rate of the silicon nitride film may be kept at 2 Å/min or higher, and the in-surface thickness uniformity of the silicon nitride film may be kept at 1.5% or lower.

(Supplementary Note 6)

According to another embodiment of the present invention, there is provided a substrate processing apparatus comprising: a process chamber configured to process a substrate; a first gas supply unit configured to supply a dichlorosilane-containing gas into the process chamber; a second gas supply unit configured to supply an ammonia-containing gas into the process chamber; a heater configured to heat the substrate in the process chamber; an exhaust unit configured to exhaust gas from the process chamber; and a controller, wherein the controller is configured to control the exhaust unit, the first gas supply unit, the second gas supply unit, and the heater, so as to perform supplying of the dichlorosilane-containing gas into the process chamber and supplying of the ammonia-containing gas into the process chamber in a manner such that the supplying of the dichlorosilane-containing gas and the supplying of the ammonia-containing gas are alternately repeated to form a silicon nitride film on the substrate, and so as to control the supplying of the ammonia-containing gas to switch the process chamber at least once between an exhaust stop state and an exhaust operation state during the supplying of the ammonia-containing gas.

What is claimed is:

1. A method of forming a silicon nitride film on a substrate, the method comprising:
   supplying a silicon-containing gas into a process chamber accommodating the substrate in a heated state by opening a first valve;
   evacuating the process chamber by closing the first valve and opening an exhaust valve;
   supplying a nitrogen-containing gas into the process chamber by opening a second valve while switching between an exhaust stop state and an exhaust operation state at least two times by repeatedly opening and closing the exhaust valve with the second valve open thereby varying an inside pressure of the process chamber such that a maximum inside pressure of the process chamber is at least twenty times higher than a minimum inside pressure of the process chamber; and
   evacuating the process chamber by closing the second valve and opening the exhaust valve.

2. A substrate processing apparatus comprising:
   a process chamber configured to process a substrate;
   a first gas supply unit configured to supply a silicon-containing gas into the process chamber by opening a first valve;
   a second gas supply unit configured to supply a nitrogen-containing gas into the process chamber by opening a second valve;
   a heater configured to heat the substrate in the process chamber;
   an exhaust unit configured to evacuate the process chamber by opening an exhaust valve; and
   a controller configured to control the exhaust unit, the first gas supply unit, the second gas supply unit and the heater,
   wherein the controller controls the first valve and the second valve such that the silicon-containing gas and the nitrogen-containing gas are alternately supplied into the process chamber to form a silicon nitride film on the substrate, and
   wherein the controller causes the exhaust unit to switch between an exhaust stop state and an exhaust operation state at least two times by repeatedly opening and closing the exhaust valve while maintaining the second valve open to supply the nitrogen-containing gas into the process chamber thereby varying an inside pressure of the process chamber such that a maximum inside pressure of the process chamber is at least twenty times higher than a minimum inside pressure of the process chamber.

* * * * *